(12) United States Patent
Schneider et al.

(10) Patent No.: US 11,600,312 B1
(45) Date of Patent: Mar. 7, 2023

(54) ACTIVATE COMMANDS FOR MEMORY PREPARATION

(71) Applicant: Micron Technology, Inc., Boise, ID (US)

(72) Inventors: Andreas Schneider, Gernlinden (DE); Casto Salobrena Garcia, Munich (DE); Martin Brox, Munich (DE); Nobuyuki Umeda, Tokyo (JP); Peter Mayer, Neubiberg (DE); Rethin Raj, Augsburg (DE)

(73) Assignee: Micron Technology, Inc., Boise, ID (US)

( * ) Notice: Subject to any disclaimer, the term of this patent is extended or adjusted under 35 U.S.C. 154(b) by 25 days.

(21) Appl. No.: 17/402,921

(22) Filed: Aug. 16, 2021

(51) Int. Cl.
*G11C 7/22* (2006.01)
*G11C 7/10* (2006.01)

(52) U.S. Cl.
CPC ............ *G11C 7/222* (2013.01); *G11C 7/1048* (2013.01); *G11C 7/1063* (2013.01); *G11C 7/1069* (2013.01); *G11C 7/1096* (2013.01)

(58) Field of Classification Search
CPC ...... G11C 7/222; G11C 7/1048; G11C 7/1063; G11C 7/1069; G11C 7/1096
See application file for complete search history.

(56) References Cited

U.S. PATENT DOCUMENTS

| | | | |
|---|---|---|---|
| 9,123,410 B2 * | 9/2015 | Castro | G11C 13/0004 |
| 9,281,036 B2 * | 3/2016 | Shen | G11C 8/10 |
| 9,792,975 B1 * | 10/2017 | Hsieh | G11C 11/4096 |
| 9,934,148 B2 * | 4/2018 | Roberts | G06F 12/0862 |
| 10,127,955 B2 * | 11/2018 | Xiao | G06F 3/0659 |
| 10,545,672 B2 * | 1/2020 | Cui | G06F 13/1689 |

\* cited by examiner

*Primary Examiner* — Tri M Hoang
(74) *Attorney, Agent, or Firm* — Holland & Hart LLP

(57) ABSTRACT

Methods, systems, and devices for activate commands for memory preparation are described. A memory device may receive an activate command for a row of a memory bank in the memory device. The activate command may include an indicator that indicates a type of an access operation associated with the activate command. The memory device may perform, based on the type of the access operation, an operation to prepare the memory device for the access operation. The memory device may then receive an access command for the access operation after performing the operation to prepare the memory device for the access operation.

20 Claims, 9 Drawing Sheets

ACTIVATE COMMANDS FOR MEMORY PREPARATION

FIELD OF TECHNOLOGY

The following relates generally to one or more systems for memory and more specifically to activate commands for memory preparation.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

In some memory systems, an access operation (e.g., a read operation, a write operation) may be indicated by an access command (e.g., a read command, a write command) that is preceded by an activate command. For example, a host device may issue an activate command to a memory device so that the memory device will activate a row of memory that is subject to a subsequent access command for an access operation. Upon receipt of the access command, the memory device may perform one or more operations (which may be referred to as preparatory operations) to prepare the memory device for the corresponding access operation. But the preparatory operations may be associated with an increase (e.g., a surge) in power consumption, which may negatively impact a data signal that is transferred shortly thereafter, among other problems.

According to the techniques described herein, a memory device may improve data signaling by performing various operations (e.g., preparatory operations) in advance of receiving the access command for an access operation.

For example, the memory device may perform one or more preparatory operations for an access operation in response to an enhanced activate command that indicates the type of access operation. Indicating the type of access operation via the enhanced activate command may enable the memory device to perform the appropriate preparatory operations for that type of access operation. For example, upon receipt of an enhanced activate command that indicates a write operation, the memory device may activate one or more circuits associated with writing (e.g., a write clock, one or more receivers), among other possible preparatory operations. Upon receipt of an enhanced activate command that indicates a read operation, the memory device may activate one or more circuits associated with reading (e.g., a read clock, one or more transmitters), among other possible preparatory operations. Performing preparatory operations for an access operation before receipt of the access command for that access operation may improve the power profile of the memory device, which in turn may improve the integrity of data signaling associated with the access operation, among other benefits.

Features of the disclosure are initially described in the context of systems and dies as described with reference to FIGS. 1 and 2. Features of the disclosure are described in the context of a memory device, power profile, and process flow as described with reference to FIGS. 3A, 3B, and 4, respectively. These and other features of the disclosure are further illustrated by and described with reference to an apparatus diagram and flowcharts that relate to activate commands for memory preparation as described with reference to FIGS. 5-9.

Figure 1:
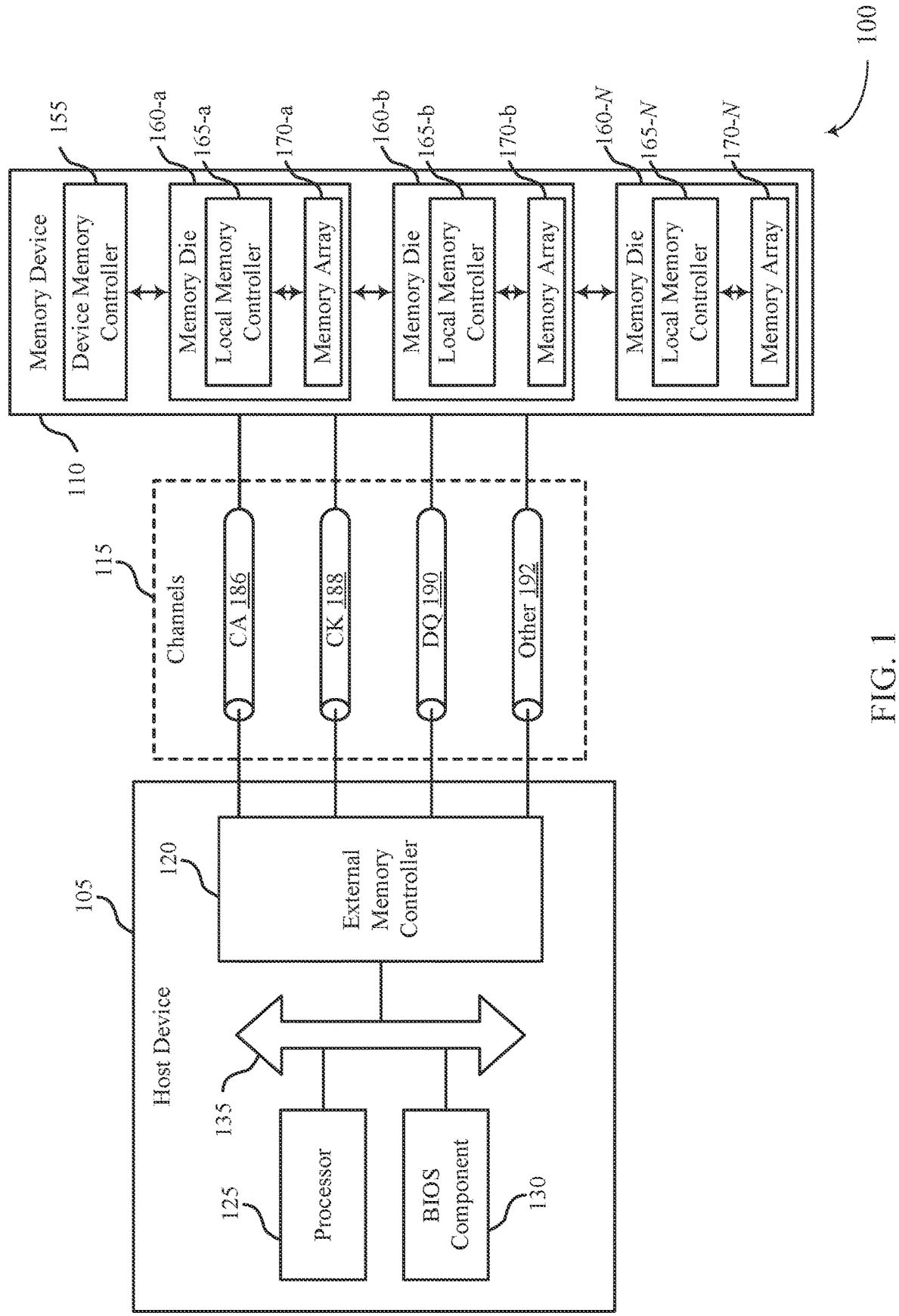
FIG. 1 illustrates an example of a system that supports activate commands for memory preparation in accordance with examples as disclosed herein.

FIG. 1 illustrates an example of a system 100 that supports activate commands for memory preparation in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-A) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the memory device 110 may perform one or more preparatory operations to prepare for an upcoming access operation. An access operation may refer to an operation that involves accessing a memory cell, and thus may include read operations and write operations, among other possible operations. Preparatory operations for an access operation may include operations that support timing and data transfer associated with the access operation, among other aspects. For example, upon receipt of an access command for an access operation, the memory device 110 may activate (e.g., start, enable, power-on) a circuit (e.g., a clock circuit) associated with the access operation, may activate communication circuitry to enable communication associated with the access operation, or a combination thereof, among other preparatory operations. But the preparatory operations performed by the memory device 110 may cause a surge in power consumption, which in turn may negatively impact data signaling that occurs shortly thereafter. For example, the surge in power consumption may cause timing variation in the data signaling, may negatively impact the integrity of the data signaling, or both, among other potential negative side effects.

According to the techniques described herein, the memory device 110 may perform one or more preparatory operations for an access operation before receipt of an access command for the access operation. For example, the memory device 110 may perform one or more preparatory operations in response to an enhanced activate command that indicates the type of access operation for which the memory device 110 is to prepare. Thus, the memory device 110 may perform one or more preparatory operations suitable for the type of access operation before receipt of an access command for that access operation. By doing so the memory device 110 may increase the amount of time between the preparatory operations (and thus the power surge) and the data transfer for the access operation, which may improve various aspects of the data signaling that is part of the data transfer.

Figure 2:
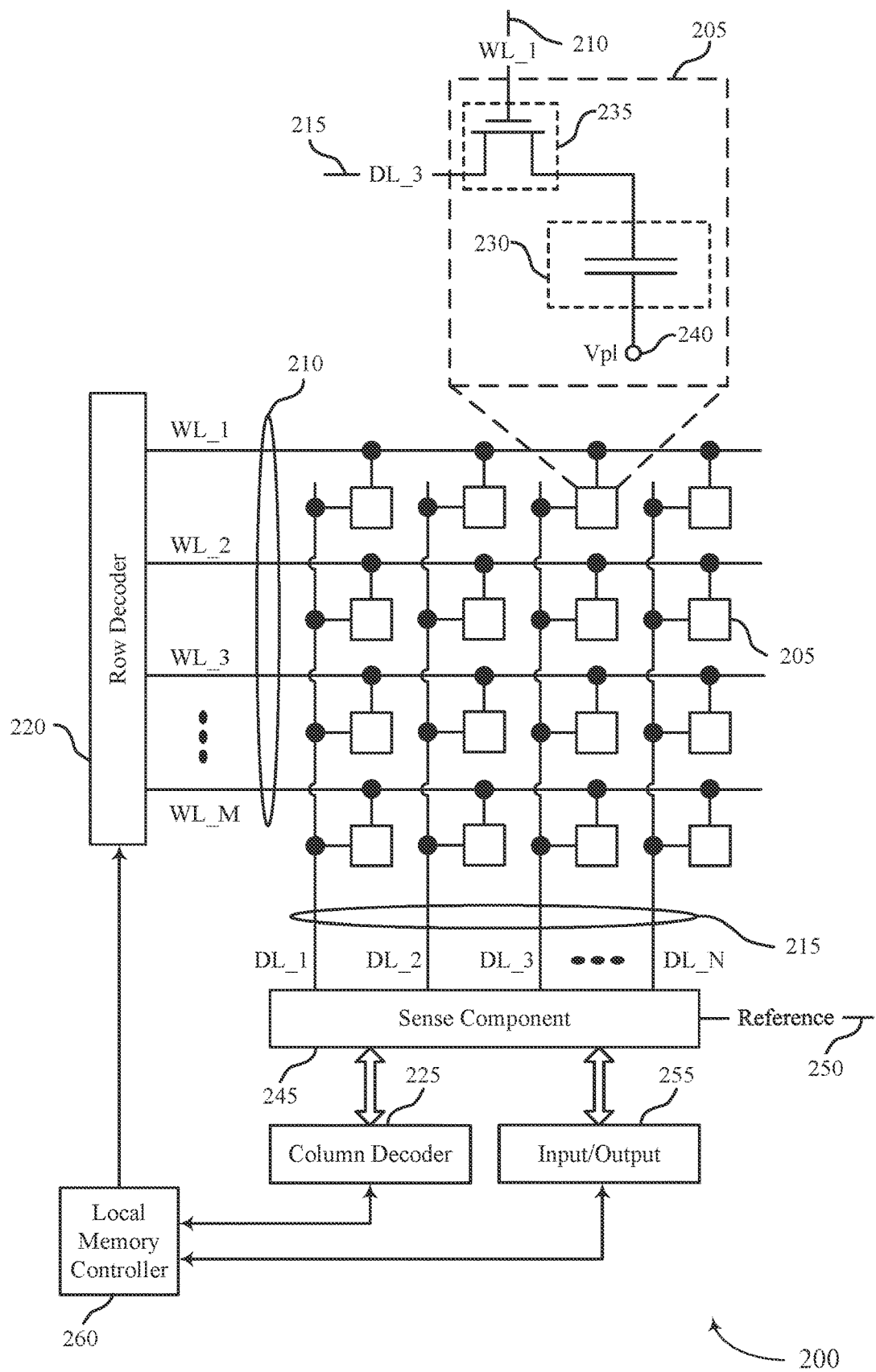
FIG. 2 illustrates an example of a memory die that supports activate commands for memory preparation in accordance with examples as disclosed herein.

FIG. 2 illustrates an example of a memory die 200 that supports activate commands for memory preparation in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

A word line 210 may be a conductive line in electronic communication with a memory cell 205 that is used to perform access operations on the memory cell 205. In some architectures, the word line 210 may be coupled with a gate of a switching component 235 of a memory cell 205 and may be operable to control the switching component 235 of the memory cell. In some architectures, the word line 210 may be coupled with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be operable to couple and/or isolate the capacitor 230 of the memory cell 205 and the digit line 215. In some architectures, the memory cell 205 may be coupled with the digit line 215.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

To increase speed and bandwidth, the memory die 200 may be configured to communicate data associated with an access operation within a threshold duration after the access command for the access operation is received. To prepare for the access operation, the memory die 200 may perform one or more preparatory operations, some or all of which may be specific to the type of access operation. So, the memory die 200 may be prevented from performing access-type-specific preparatory operations for an access operation until receipt of the access command that indicates the type of access operation. But waiting until receipt of an access command to perform access-type-specific preparatory operations for an access command may result in a power surge that occurs temporally close to the data transfer for the corresponding access operation, which may negatively impact the integrity of the data transfer.

According to the techniques described herein, the memory die 200 may improve data transfer integrity (while maintaining speed and bandwidth) by using an enhanced activate (ACT) command (which indicates a type of access operation) to perform access-type-specific preparatory operations for the access operation before receipt of the corresponding access command.

Figure 3A:
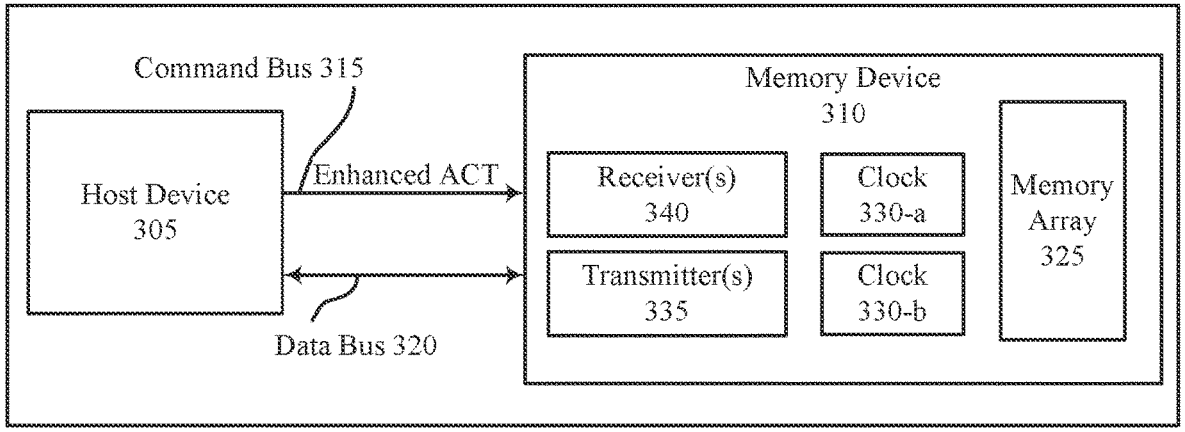
FIG. 3A illustrates an example of a memory device that supports activate commands for memory preparation in accordance with examples as disclosed herein.

FIG. 3A illustrates an example of a system 300 that supports activate commands for memory preparation in accordance with examples as disclosed herein. The system 300 may include a host device 305 and a memory device 310, which may be examples of the host device 105 and the memory device 110 as described with reference to FIG. 1. The host device 305 and the memory device 310 may be coupled via one or more buses that permit signaling between the devices. For example, the host device 305 may use the command bus 315 to communicate commands to the memory device 310, and both devices may use the data bus 320 to communicate data to the other device. According to the techniques described herein, the host device 305 may transmit (e.g., over the command bus 315) an enhanced ACT command to the memory device 310 so that the memory device 310 can perform one or more preparatory operations for an access operation corresponding to the enhanced ACT command. As noted, the enhanced ACT command may indicate the type of access operation corresponding to (e.g., associated with) the enhanced ACT command and at least some of the preparatory operations performed by the memory device 310 may be specific to the type of access operation.

An activate command that excludes an indication of the type of access operation corresponding to the activate command may be referred to herein as an unenhanced ACT command. Other than the indication of the type of access operation, enhanced ACT commands and unenhanced ACT commands may convey similar information.

The memory device 310 may store data for the host device 305 in a memory array 325, and the host device 305 may access data in the memory array 325 by initiating (e.g., instigating) access operations by the memory device 310. For example, the host device 305 may initiate write operations to write data to the memory array 325 and may initiate read operations to read data from the memory array 325.

To initiate an access operation at the memory device 310, the host device 305 may issue an ACT command (e.g., an enhanced ACT command or an unenhanced ACT command) that indicates address information for the access operation followed by an access command (e.g., a read command or a write command) that indicates additional information for the access operation. For example, an ACT command may indicate a bank address and a row address for the access operation whereas an access command may indicate a column address for the access operation. The ACT command may prompt the memory device 310 to activate (or "open") the row of the bank indicated by the address information in the ACT command and the access command may prompt the memory device 310 to read or write the column(s) indicated by the address information in the access command. Alternative address information may be conveyed by the ACT command and access commands and the ACT command and access commands are not limited to conveying the combinations of address information described herein.

According to the techniques described herein, the host device 305 may issue enhanced ACT commands to the memory device 310 so that the memory device 310 is able to earlier start access-type-specific preparatory operations for corresponding access operations. An enhanced ACT command may include an indicator (e.g., a flag, one or more bits) that indicates the type of access operation corresponding to the enhanced ACT command. Thus, the host device 305 may determine the type of access operation to which an enhanced ACT command corresponds before issuing the enhanced ACT command.

Upon receipt of the enhanced ACT command, the memory device 310 may perform one or more access-type-specific preparatory operations for the corresponding access operation. For example, if the enhanced ACT command indicates a read operation, the memory device 310 may activate one or more circuits associated with reading. In some examples, the memory device 310 may start a clock 330 (e.g., clock 330-$a$) that is associated with reading. The clock 330-$a$ may provide timing information (e.g., clock signals) that allows the memory device 310 to properly time the read operation, perform synchronous operations for the read operation, or both, among other advantages. Starting the clock 330-$a$ upon receipt of the enhanced ACT command may consume less power compared to other techniques, such as those that keep the clock 330-$a$ on at all times. Additionally or alternatively, the memory device 310 may activate one or more transmitter(s) 335 so that the memory device 310 can transmit data from the read operation over the data bus 320. Activating the transmitter(s) 335 upon receipt of the enhanced ACT command may consume less power compared to other techniques, such as those that keep the transmitter(s) 335 activated at all times.

If the enhanced ACT command indicates a write operation, the memory device 310 may activate one or more circuits associated with writing. In some examples, the memory device 310 may start a clock 330 (e.g., clock 330-$b$) that is associated with writing. The clock 330-$b$ may provide timing information (e.g., clock signals) that allows the memory device 310 to properly time the write operation, perform synchronous operations for the write operation, or both, among other advantages. Starting the clock 330-$b$ upon receipt of the enhanced ACT command may consume less power compared to other techniques, such as those that keep the clock 330-$b$ on at all times. Additionally or alternatively, the memory device 310 may activate one or more receiver(s) 340 so that the memory device 310 can receive data for the write operation over the data bus 320. Activating the receiver(s) 340 upon receipt of the enhanced ACT command may consume less power compared to other techniques, such as those that keep the receiver(s) 340 activated at all times.

The memory array 325 may include multiple banks. In some examples, a single row per bank may be open at a given time. In such examples, the host device 305 may issue a precharge (PRE) command to close a row of a bank before issuing an ACT command for another row in the bank. The PRE command may also cause the memory device 310 to deactivate some or all of the circuit(s) that were previously activated in response to an enhanced ACT command. In between the initial ACT command and the PRE command for a row of a bank, the host device 305 may issue a quantity of additional ACT commands and access commands directed to that row. If the data bus 320 is a bi-directional bus (e.g., a bus that supports data signaling in two different directions, potentially at different times), the host device 305 may issue commands for the same type of access operation (e.g., all write commands) in bursts, which may increase efficiency by preventing frequent direction-switching of the data bus 320. A burst of commands may refer to the commands for one type of access operation that are book-ended by commands for a different type of access operation.

In some examples, the host device 305 may conserve power by using a mix of enhanced ACT command and unenhanced ACT commands within a burst of commands of the same access type. For example, the host device 305 may use an enhanced ACT command for the first (e.g., initial, leading, temporally first) access operation of a given type (e.g., the write type). However, the host device 305 may use unenhanced ACT commands for subsequent (e.g., following) access commands within the same burst. Using unenhanced ACT commands within a burst may conserve power at the host device 305, the memory device 310, or both, because an unenhanced ACT command may include fewer bits than an enhanced ACT command. For example, the host device 305 may consume less power transmitting unenhanced ACT commands relative to enhanced ACT commands and the memory device 310 may consume less power receiving or processing unenhanced ACT commands relative to enhanced ACT commands.

Performing preparatory operations for access operations before receipt of access commands for the access operations may temporally displace the power consumption associated with the preparatory operations so that the subsequent data signaling is less affected.

Figure 3B:
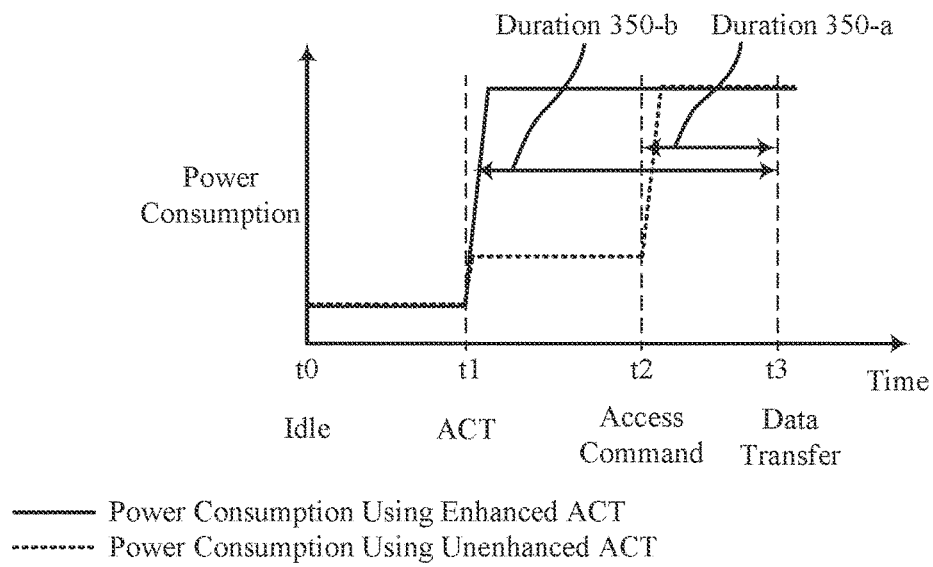
FIG. 3B illustrates an example of a power profile that supports activate commands for memory preparation in accordance with examples as disclosed herein.

FIG. 3B illustrates a power profile 345 that supports activate commands for memory preparation in accordance with examples as disclosed herein. The power profile 345 shows, as a function of time, the relative power consumption of the memory device 310 for an enhanced ACT command and an unenhanced ACT command. The power consumption when an enhanced ACT command is used is shown as an unbroken line, whereas the power consumption when an unenhanced ACT command is used is shown as a dashed line.

At time t0, the memory device 310 may be in an idle mode. During the idle mode, various circuits such as the clocks 330, the transmitters(s) 335, the receiver(s) 340, or a combination thereof may be powered down (e.g., deactivated, disabled). At time t1, the host device 305 may issue an ACT command for an access operation. If the host device 305 issues an unenhanced ACT command, the memory device 310 may wait until receipt of the following access command to perform access-type-specific preparatory operations for the access operation (e.g., because the memory device 310 does not know which type of access operation for which to prepare). Thus, the memory device 310 may delay access-type-specific preparatory operations until time t2 and in doing so may cause a surge in power consumption that negatively impacts a data transfer for the access operation that occurs at time t3.

However, if the host device 305 issues an enhanced ACT command at time t1, the memory device 310 may begin performing access-type specific preparatory operations for the access operation at, or just after, time t1 (e.g., because the enhanced ACT indicates the type of access operation for which the memory device is to prepare). Thus, the memory device 310 may perform the access-type-specific preparatory operations in advance of the corresponding access command received at time t2 and in doing so may increase the amount of time between the power surge associated with the preparatory operations and the data transfer at time t3. For example, relative to the unenhanced ACT command example, the memory device 310 may increase the amount of time between the power surge and the data transfer from duration 350-*a* to duration 350-*b*. Thus, the integrity of the data signal may be improved without increasing the latency of the data transfer (as can be seen in FIG. 3B, the data transfer occurs at time t3 regardless of the type of ACT command used).

Figure 4:
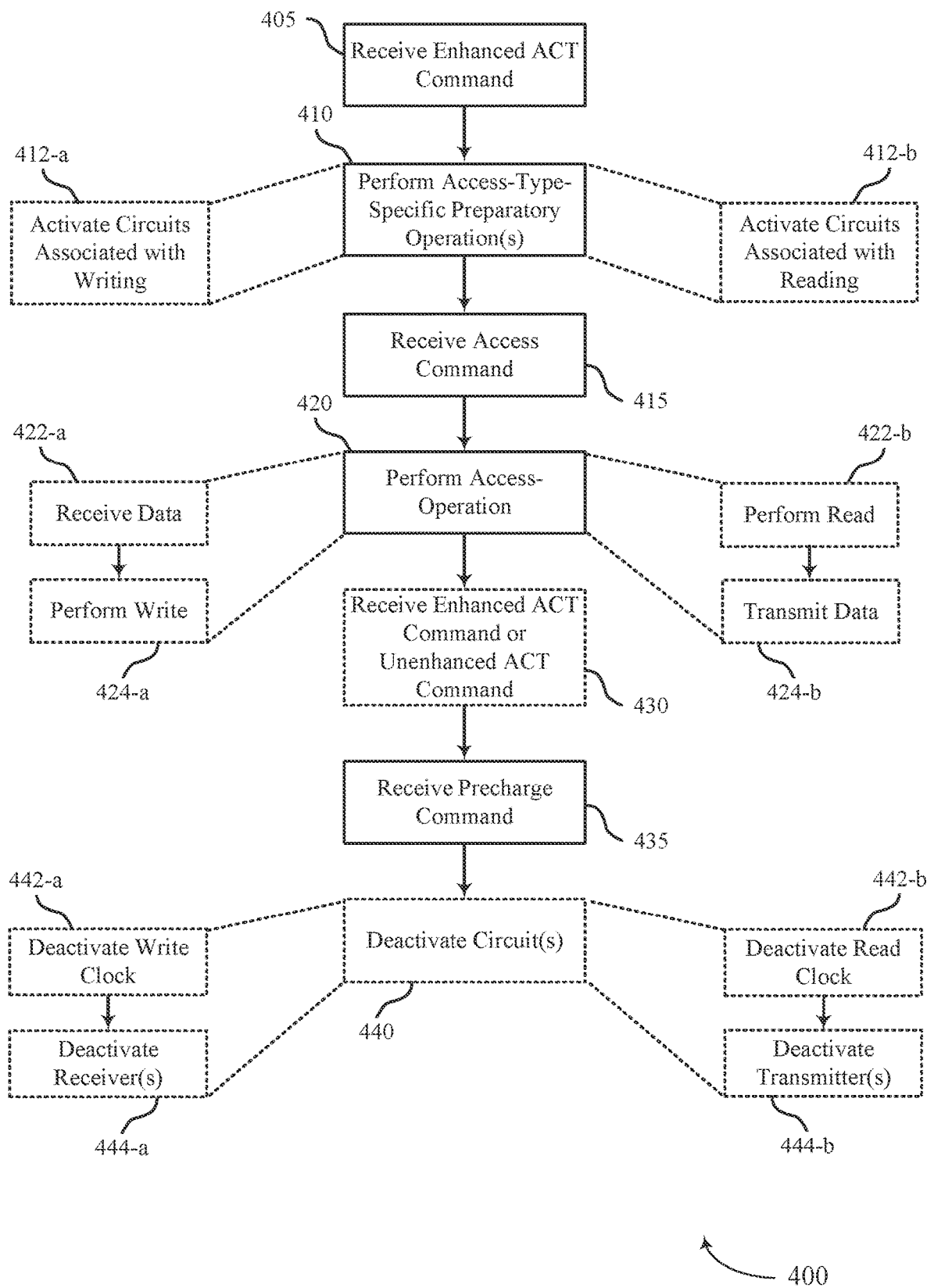
FIG. 4 illustrates an example of a process flow that supports activate commands for memory preparation in accordance with examples as disclosed herein.

FIG. 4 illustrates an example of a process flow 400 that supports activate commands for memory preparation in accordance with examples as disclosed herein. The process flow 400 may be implemented by a memory device, which may be an example of memory device as described with reference to FIGS. 1 and 3. However, other types of devices or components (or combinations thereof) may implement the process flow 400.

At 405, the memory device may receive an enhanced ACT command from a host device coupled with the memory device. The enhanced ACT command may include a row address, a bank address, and an indicator of a type of access operation corresponding to the enhanced ACT command. In some examples, the indicator may be one or more bits. For example, the indicator may be a single bit and a first logic value of the bit may indicate a read operation whereas a second logic value of the bit may indicate a write operation. Thus, the enhanced ACT command may indicate whether a corresponding access operation is of a given type, such as a read operation or a write operation. Phrased another way, the enhanced ACT command may indicate whether a corresponding access command is a read command or a write command. In some examples, the enhanced ACT command may be communicated from a host device that determines the row address for the type of access operation before transmitted the enhanced ACT command.

In some examples, the memory device may activate the row of the bank indicated by the enhanced ACT command. Activating a row may refer to applying a voltage to the word line associated with the row and may be performed regardless of the type of access operation. In some examples, the row may be activated before or after performing the access-type-specific preparatory operations at 410. In some examples, the row may be activated at least partially concurrent with performing the access-type-specific preparatory operations at 410.

At 410, the memory device may perform one or more preparatory operations (e.g., one or more access-type-specific preparatory operations) to prepare for the access operation corresponding to the enhanced ACT command. The memory device may perform the one or more access-type-specific preparatory operations is response to the enhanced command and based on the indicator. For example, if the indicator indicates that the corresponding access operation is a write operation, the memory device may, at 412-*a*, activate one or more circuits associated with writing. For instance, the memory device may activate a clock associated with writing. Additionally or alternatively, the memory device may activate one or more receivers (e.g., for receiving a set of data associated with the write operation). As another example, if the indicator indicates that the corresponding access operation is a read operation, the memory device may, at 412-*b*, activate one or more circuits associated with reading. For example, the memory device may activate a clock associated with reading. The clock associated with reading may be different than the clock associated with writing (e.g., to account for timing differences between reading and writing). Additionally or alternatively, the memory device may activate one or more transmitters (e.g., for transmitting a set of data associated with the read operation).

At 415, the memory device may receive an access command associated with the enhanced ACT command. The access command may be communicated by the host device and may be a read command or a write command. At 420, the memory device may perform the access operation indicated by the access command. For example, if the access command is a write command, the memory device may, at 422-*a*, receive data to be written to the memory array 325. The memory device may also, at 424-*a*, perform a write operation to write the data to the memory array 325. As another example, if the access command is a read command, the memory device may, at 422-*b*, perform a read operation to read data from the memory array 325. The memory device may also, at 424-*b*, transmit the data read from the memory array 325 to the host device.

At 430, the memory device may receive another activate command. The activate command may be for the same row and bank as the enhanced ACT command received at 405 and may be associated with the same type of access operation. In some examples, the activate command may be an enhanced ACT command, which may reduce signaling and processing complexity (relative to an unenhanced ACT command). In other examples, the activate command may be an unenhanced ACT command, which may reduce power consumption (relative to an enhanced ACT command). In these examples, the host device may determine that the later activate command is for the same type of access operation as the enhanced ACT command and, based on the determination, may issue the activate command as an unenhanced ACT command rather than an enhanced ACT command.

At 435, the memory device may receive a precharge command for the row of the bank indicated by the enhanced ACT command that was received at 405. The precharge command may be communicated by the host device. At 440, the memory device may deactivate (e.g., disable, power-down, turn off) one or more of the circuits activated at 410. For example, if the access operation was a write operation, the memory device may, at 442-*a*, deactivate the write clock. Additionally or alternatively, the memory device may, at 444-*a*, deactivate the one or more receivers. If the access operation was a read operation, the memory device may, at 442-*b*, deactivate the read clock. Additionally or alternatively, the memory device may, at 444-*b*, deactivate the one or more transmitters. The memory device may also close (e.g., deactivate) the row of the bank in response to the precharge command.

In some cases, the memory device may receive an enhanced ACT command after 440. The enhanced command may be communicated by the host device may be for the same row or a different row. In some examples, the enhanced ACT command may be for a different type of access operation than the enhanced ACT command received at 405. For example, the enhanced ACT command received at 405 may indicate (explicitly) a read operation and the enhanced ACT command received after 440 may indicate (e.g., explicitly) a write operation. In such a scenario, the memory device may deactivate the circuits associated with reading at 440 and may activate the circuits associated with writing after 440 (e.g. in response to the enhanced ACT command received after 440). Alternatively, if the enhanced ACT command received at 405 indicates a write operation and the enhanced ACT command received after 440 indicates a read operation, the memory device may deactivate the circuits associated with writing at 440 and may activate the circuits associated with reading after 440 (e.g. in response to the enhanced ACT command received after 440).

In other examples, the enhanced ACT command received after 440 may be for the same type of access operation as the enhanced ACT command received at 405. In such a scenario, the memory device may re-activate the circuits associated with the type of access operation after deactivating the circuits at 440.

Thus, the memory device may improve data signaling by performing access-type-specific preparatory operations for an access operation before receipt of the access command for the access operation. Alternative examples of the foregoing may be implemented, where some operations are performed in a different order than described, are performed in parallel, or are not performed at all. In some cases, operations may include additional features not mentioned herein, or further operations may be added. Additionally, certain operations may be performed multiple times or certain combinations of operations may repeat or cycle.

Figure 5:
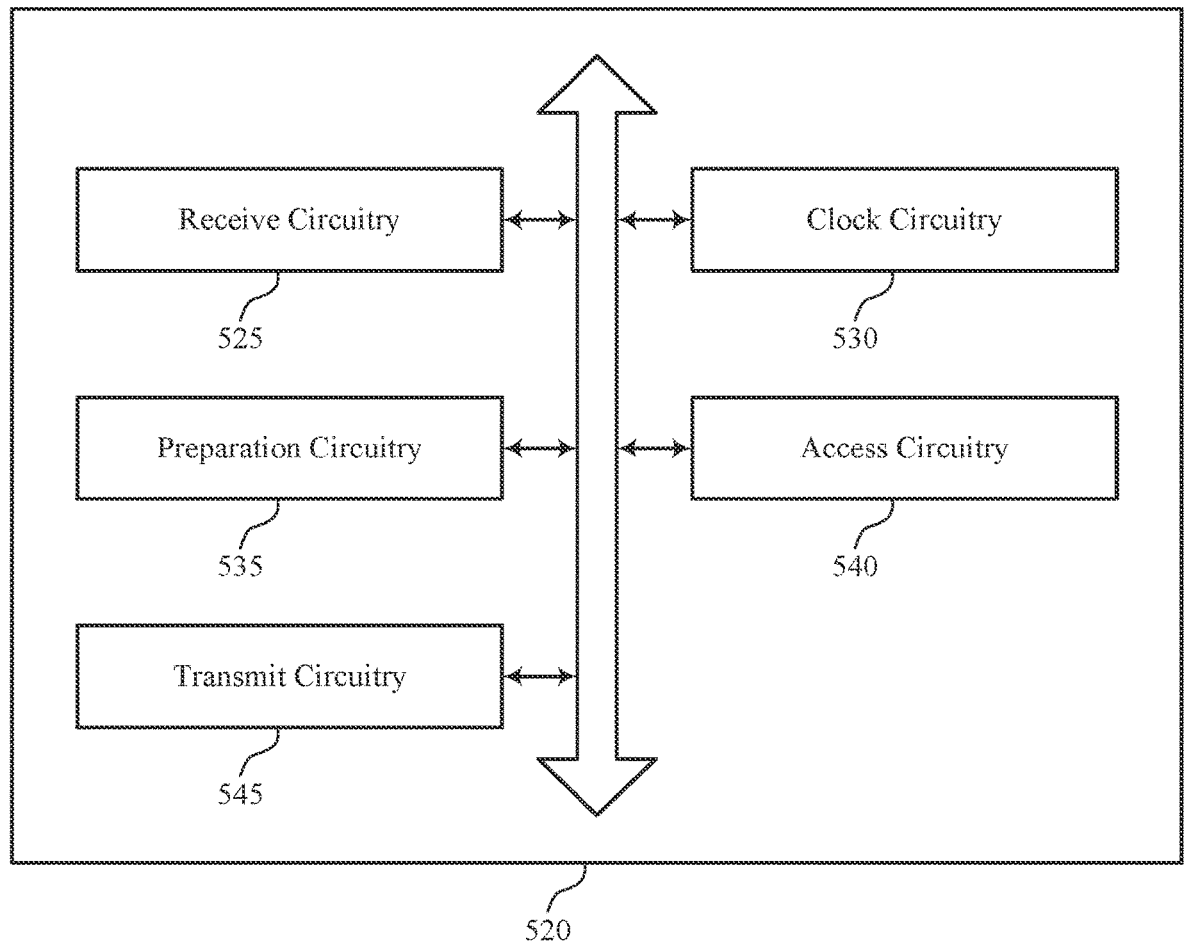
FIG. 5 shows a block diagram of a memory device that supports activate commands for memory preparation in accordance with examples as disclosed herein.

FIG. 5 shows a block diagram 500 of a memory device 520 that supports activate commands for memory preparation in accordance with examples as disclosed herein. The memory device 520 may be an example of aspects of a memory device as described with reference to FIGS. 1 through 4. The memory device 520, or various components thereof, may be an example of means for performing various aspects of activate commands for memory preparation as described herein. For example, the memory device 520 may include a receive circuitry 525, a clock circuitry 530, a preparation circuitry 535, an access circuitry 540, a transmit circuitry 545, or any combination thereof. Each of these components may communicate, directly or indirectly, with one another (e.g., via one or more buses).

The receive circuitry 525 may be configured as or otherwise support a means for receiving an activate command for a row of a memory bank in the memory device, the activate command including an indicator that indicates a corresponding access command for the row of the memory bank is a write command or a read command. The clock circuitry 530 may be configured as or otherwise support a means for activating a first clock associated with writing or a second clock associated with reading based at least in part on the indicator in the activate command. In some examples, the receive circuitry 525 may be configured as or otherwise support a means for receiving the access command after activating the first clock or the second clock.

In some examples, the access circuitry 540 may be configured as or otherwise support a means for writing a set of data to the row of the memory bank, or reading a set of data from the row of the memory bank, based at least in part on receiving the access command.

In some examples, the indicator indicates that the access command is a write command, and the receive circuitry 525 may be configured as or otherwise support a means for activating, before receiving the write command, a receiver based at least in part on the indicator in the activate command indicating the write command. In some examples, the indicator indicates that the access command is a write command, and the receive circuitry 525 may be configured as or otherwise support a means for receiving a set of data to be written to the row of the memory bank based at least in part on activating the receiver.

In some examples, the indicator indicates that the access command is a read command, and the transmit circuitry 545 may be configured as or otherwise support a means for activating, before receiving the read command, a transmitter based at least in part on the indicator in the activate command indicating the read command. In some examples, the indicator indicates that the access command is a read command, and the transmit circuitry 545 may be configured as or otherwise support a means for transmitting a set of data from the row of the memory bank based at least in part on activating the transmitter.

In some examples, the receive circuitry 525 may be configured as or otherwise support a means for receiving a precharge command for the row of the memory bank. In some examples, the clock circuitry 530 may be configured as or otherwise support a means for deactivating the first clock or the second clock based at least in part on the precharge command.

In some examples, the receive circuitry 525 may be configured as or otherwise support a means for receiving a second activate command for the row of the memory bank, the second activate command including a second indicator that indicates a second access command following the second activate command is of a same type as the access command.

In some examples, the receive circuitry 525 may be configured as or otherwise support a means for receiving a second activate command for the row of the memory bank, the second activate command excluding a second indicator that indicates a second access command following the second activate command is of a same type as the access command.

In some examples, the receive circuitry 525 may be configured as or otherwise support a means for receiving an activate command for a row of a memory bank in the memory device, the activate command including an indicator that indicates a type of an access operation associated with the activate command. The preparation circuitry 535 may be configured as or otherwise support a means for performing, based at least in part on the type of the access operation, an operation to prepare the memory device for the access operation. In some examples, the receive circuitry 525 may be configured as or otherwise support a means for receiving an access command for the access operation after performing the operation to prepare the memory device for the access operation.

In some examples, the access command includes a write command and the access operation includes a write operation, and the access circuitry 540 may be configured as or otherwise support a means for performing the write operation based at least in part on receiving the write command.

In some examples, the access command includes a read command and the access operation includes a read operation, and the access circuitry 540 may be configured as or otherwise support a means for performing the read operation based at least in part on receiving the read command.

In some examples, the access circuitry 540 may be configured as or otherwise support a means for activating the row of the memory bank based at least in part receiving the activate command, where the row is activated before or after performing the operation to prepare the memory device for the access operation.

In some examples, the access circuitry 540 may be configured as or otherwise support a means for activating the row of the memory bank based at least in part receiving the activate command, where the row is activated at least partially concurrent with performing the operation to prepare the memory device for the access operation.

In some examples, to support performing the operation, the preparation circuitry 535 may be configured as or otherwise support a means for activating a clock associated with writing based at least in part on the indicator in the activate command indicating the write operation. In some examples, to support performing the operation, the preparation circuitry 535 may be configured as or otherwise support a means for activating a clock associated with reading based at least in part on the indicator in the activate command indicating the read operation.

In some examples, the receive circuitry 525 may be configured as or otherwise support a means for receiving a precharge command for the row. In some examples, the clock circuitry 530 may be configured as or otherwise support a means for deactivating the clock based at least in part on the precharge command. In some examples, the receive circuitry 525 may be configured as or otherwise support a means for receiving a second activate command including a second indicator that indicates a write operation associated with the second activate command. In some examples, the clock circuitry 530 may be configured as or otherwise support a means for activating a second clock associated with writing based at least in part on the indicator in the activate command indicating the write operation.

In some examples, to support performing the operation, the preparation circuitry 535 may be configured as or otherwise support a means for activating a receiver of the memory device. In some examples, to support performing the operation, the preparation circuitry 535 may be configured as or otherwise support a means for receiving a set of data for the write operation using the activated receiver, or where the indicator indicates a read operation, and where performing the operation includes.

In some examples, the indicator indicates a read operation, and the transmit circuitry 545 may be configured as or otherwise support a means for transmitting a set of data from the read operation using the activated transmitter.

Figure 6:
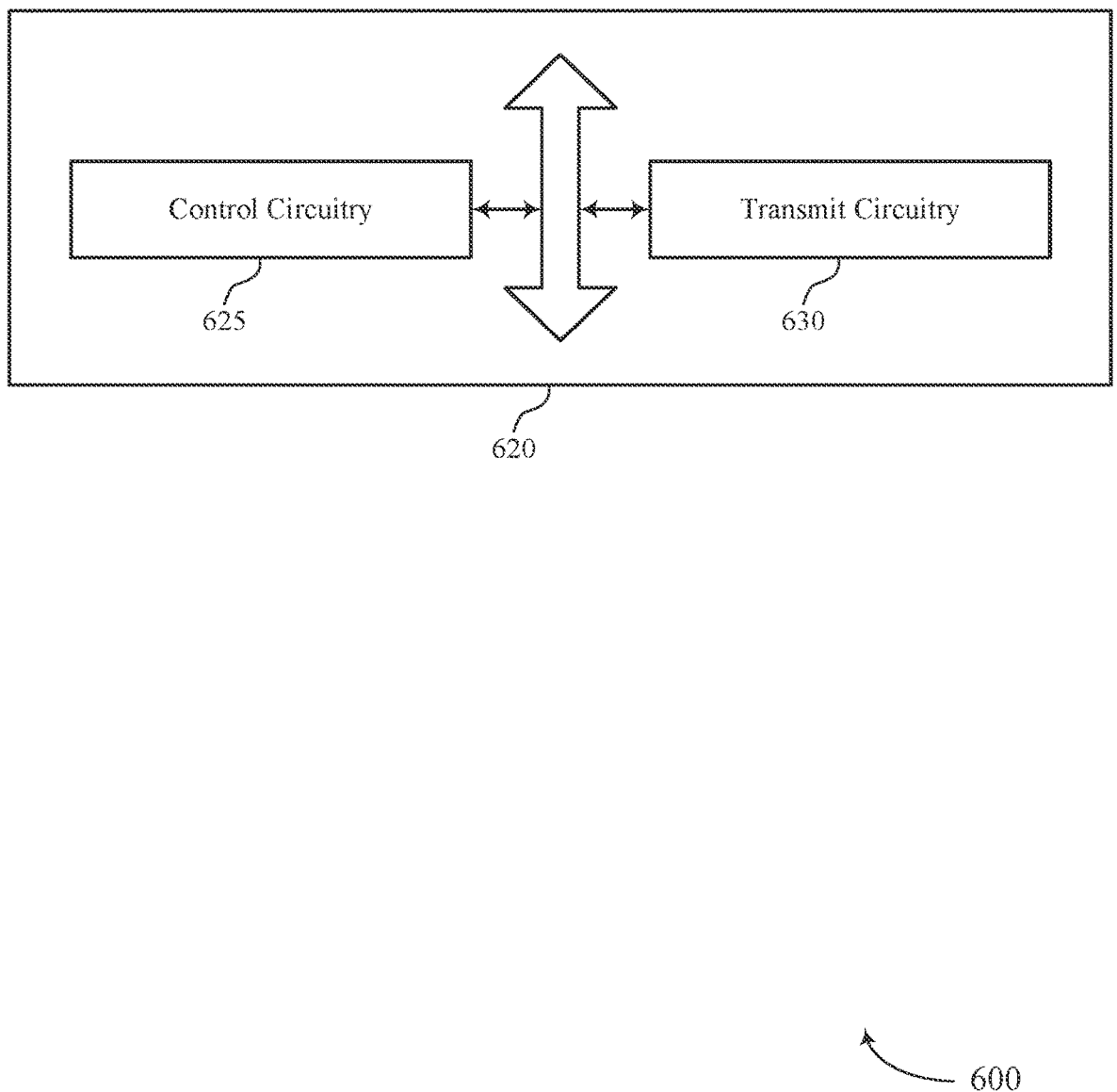
FIG. 6 shows a block diagram of a host device that supports activate commands for memory preparation in accordance with examples as disclosed herein.

FIG. 6 shows a block diagram 600 of a host device 620 that supports activate commands for memory preparation in accordance with examples as disclosed herein. The host device 620 may be an example of aspects of a host device as described with reference to FIGS. 1 through 4. The host device 620, or various components thereof, may be an example of means for performing various aspects of activate commands for memory preparation as described herein. For example, the host device 620 may include a control circuitry 625 a transmit circuitry 630, or any combination thereof. Each of these components may communicate, directly or indirectly, with one another (e.g., via one or more buses).

The control circuitry 625 may be configured as or otherwise support a means for determining a row of a memory bank in a memory of a memory device for a type of an access operation. The transmit circuitry 630 may be configured as or otherwise support a means for transmitting an activate command for the row of the memory bank to the memory device based at least in part on the determination, the activate command including an indicator that indicates the type of the access operation. In some examples, the transmit circuitry 630 may be configured as or otherwise support a means for transmitting an access command of the type for the row of the memory bank based at least in part on transmitting the activate command for the row of the memory bank.

In some examples, the transmit circuitry 630 may be configured as or otherwise support a means for transmitting a second activate command that is associated with a second access operation and that includes a second indicator that indicates the second access operation is of the type.

In some examples, the control circuitry 625 may be configured as or otherwise support a means for determining that a second access operation associated with the row is of the type. In some examples, the transmit circuitry 630 may be configured as or otherwise support a means for transmitting, based at least in part on determining that the second access operation is of the type, a second activate command that is associated with the second access operation and that excludes a second indicator that indicates the second access operation is of the type.

In some examples (e.g., if the row of the memory bank is determined for a read operation), and the transmit circuitry 630 may be configured as or otherwise support a means for transmitting a precharge command for the row of the memory bank. In some examples, the control circuitry 625 may be configured as or otherwise support a means for determining a second row for the write operation. In some examples, the transmit circuitry 630 may be configured as or otherwise support a means for transmitting a second activate command to the memory device, the second activate command including a second indicator that indicates the write operation.

Figure 7:
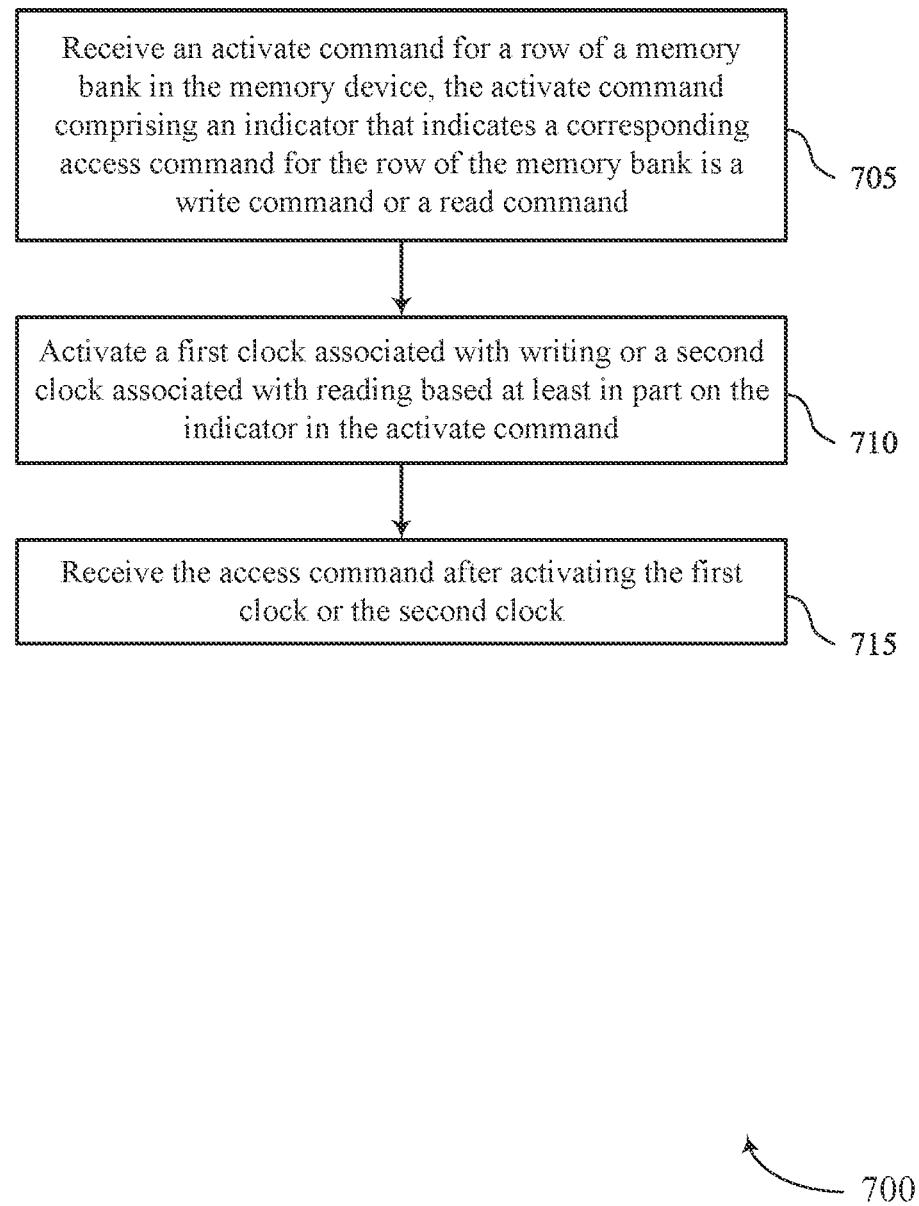
FIGS. 7 through 9 show flowcharts illustrating a method or methods that support activate commands for memory preparation in accordance with examples as disclosed herein.

FIG. 7 shows a flowchart illustrating a method 700 that supports activate commands for memory preparation in accordance with examples as disclosed herein. The operations of method 700 may be implemented by a memory device or its components as described herein. For example, the operations of method 700 may be performed by a memory device as described with reference to FIGS. 1 through 5. In some examples, a memory device may execute a set of instructions to control the functional elements of the device to perform the described functions. Additionally or alternatively, the memory device may perform aspects of the described functions using special-purpose hardware.

At 705, the method may include receiving an activate command for a row of a memory bank in the memory device, the activate command including an indicator that indicates a corresponding access command for the row of the memory bank is a write command or a read command. The operations of 705 may be performed in accordance with examples as disclosed herein. In some examples, aspects of the operations of 705 may be performed by a receive circuitry 525 as described with reference to FIG. 5.

At 710, the method may include activating a first clock associated with writing or a second clock associated with reading based at least in part on the indicator in the activate command. The operations of 710 may be performed in accordance with examples as disclosed herein. In some examples, aspects of the operations of 710 may be performed by a clock circuitry 530 as described with reference to FIG. 5.

At 715, the method may include receiving the access command after activating the first clock or the second clock. The operations of 715 may be performed in accordance with examples as disclosed herein. In some examples, aspects of the operations of 715 may be performed by a receive circuitry 525 as described with reference to FIG. 5.

In some examples, an apparatus as described herein may perform a method or methods, such as the method 700. The apparatus may include, features, circuitry, logic, means, or instructions (e.g., a non-transitory computer-readable medium storing instructions executable by a processor) for receiving an activate command for a row of a memory bank in the memory device, the activate command including an indicator that indicates a corresponding access command for the row of the memory bank is a write command or a read command, activating a first clock associated with writing or a second clock associated with reading based at least in part on the indicator in the activate command, and receiving the access command after activating the first clock or the second clock.

Some examples of the method 700 and the apparatus described herein may further include operations, features, circuitry, logic, means, or instructions for writing a set of data to the row of the memory bank, or reading a set of data from the row of the memory bank, based at least in part on receiving the access command.

In some examples of the method 700 and the apparatus described herein, the indicator indicates that the access command may be a write command and the method, apparatuses, and non-transitory computer-readable medium may include further operations, features, circuitry, logic, means, or instructions for activating, before receiving the write command, a receiver based at least in part on the indicator in the activate command indicating the write command and receiving a set of data to be written to the row of the memory bank based at least in part on activating the receiver.

In some examples of the method 700 and the apparatus described herein, the indicator indicates that the access command may be a read command and the method, apparatuses, and non-transitory computer-readable medium may include further operations, features, circuitry, logic, means, or instructions for activating, before receiving the read command, a transmitter based at least in part on the indicator in the activate command indicating the read command and transmitting a set of data from the row of the memory bank based at least in part on activating the transmitter.

Some examples of the method 700 and the apparatus described herein may further include operations, features, circuitry, logic, means, or instructions for receiving a precharge command for the row of the memory bank and deactivating the first clock or the second clock based at least in part on the precharge command.

Some examples of the method 700 and the apparatus described herein may further include operations, features, circuitry, logic, means, or instructions for receiving a second activate command for the row of the memory bank, the second activate command including a second indicator that indicates a second access command following the second activate command may be of a same type as the access command.

Some examples of the method 700 and the apparatus described herein may further include operations, features, circuitry, logic, means, or instructions for receiving a second activate command for the row of the memory bank, the second activate command excluding a second indicator that indicates a second access command following the second activate command may be of a same type as the access command.

Figure 8:
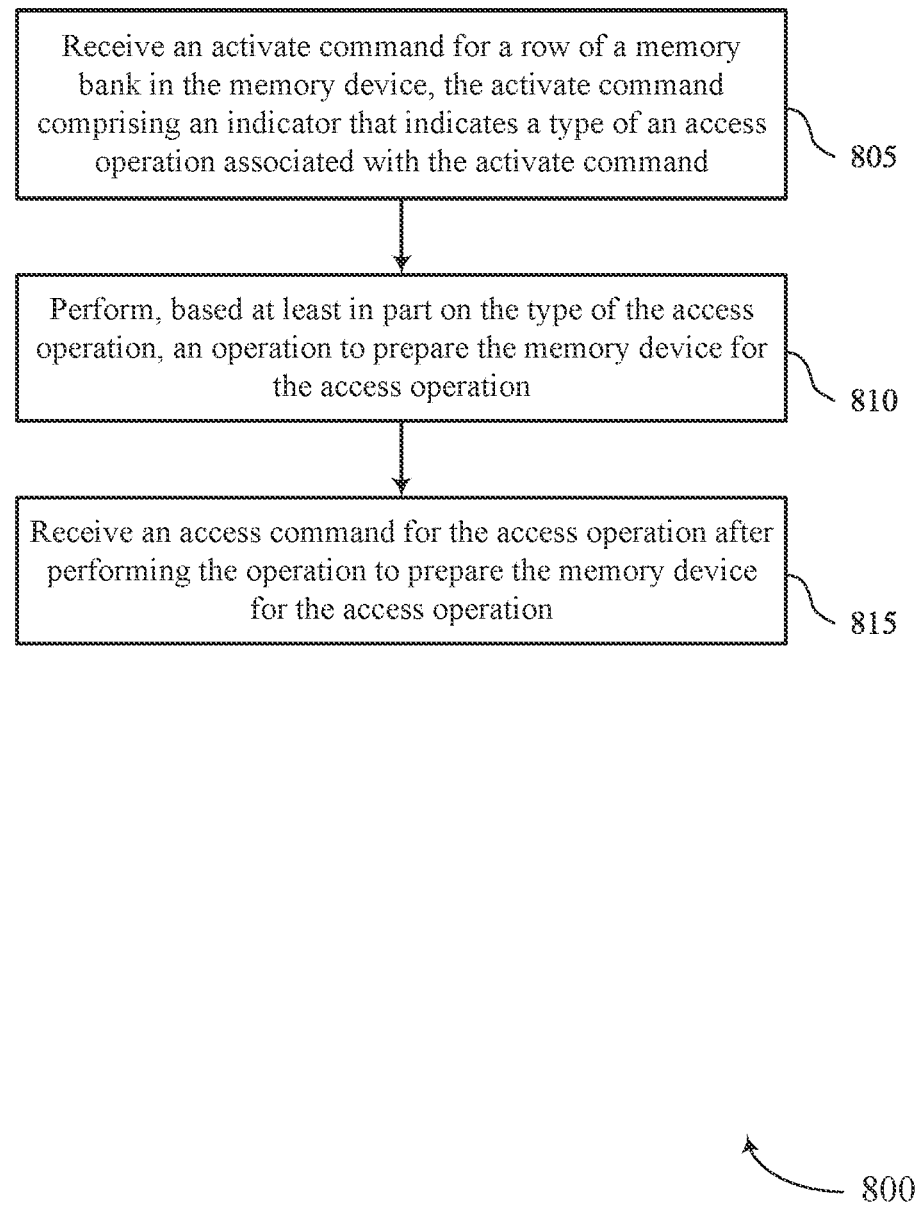

FIG. 8 shows a flowchart illustrating a method 800 that supports activate commands for memory preparation in accordance with examples as disclosed herein. The operations of method 800 may be implemented by a memory device or its components as described herein. For example, the operations of method 800 may be performed by a memory device as described with reference to FIGS. 1 through 5. In some examples, a memory device may execute a set of instructions to control the functional elements of the device to perform the described functions. Additionally or alternatively, the memory device may perform aspects of the described functions using special-purpose hardware.

At 805, the method may include receiving an activate command for a row of a memory bank in the memory device, the activate command including an indicator that indicates a type of an access operation associated with the activate command. The operations of 805 may be performed in accordance with examples as disclosed herein. In some examples, aspects of the operations of 805 may be performed by a receive circuitry 525 as described with reference to FIG. 5.

At 810, the method may include performing, based at least in part on the type of the access operation, an operation to prepare the memory device for the access operation. The operations of 810 may be performed in accordance with examples as disclosed herein. In some examples, aspects of the operations of 810 may be performed by a preparation circuitry 535 as described with reference to FIG. 5.

At 815, the method may include receiving an access command for the access operation after performing the operation to prepare the memory device for the access operation. The operations of 815 may be performed in accordance with examples as disclosed herein. In some examples, aspects of the operations of 815 may be performed by a receive circuitry 525 as described with reference to FIG. 5.

In some examples, an apparatus as described herein may perform a method or methods, such as the method 800. The apparatus may include, features, circuitry, logic, means, or instructions (e.g., a non-transitory computer-readable medium storing instructions executable by a processor) for receiving an activate command for a row of a memory bank in the memory device, the activate command including an indicator that indicates a type of an access operation associated with the activate command, performing, based at least in part on the type of the access operation, an operation to prepare the memory device for the access operation, and receiving an access command for the access operation after performing the operation to prepare the memory device for the access operation.

In some examples of the method 800 and the apparatus described herein, the access command includes a write command and the access operation includes a write operation and the method, apparatuses, and non-transitory computer-readable medium may include further operations, features, circuitry, logic, means, or instructions for performing the write operation based at least in part on receiving the write command.

In some examples of the method 800 and the apparatus described herein, the access command includes a read command and the access operation includes a read operation and the method, apparatuses, and non-transitory computer-readable medium may include further operations, features, circuitry, logic, means, or instructions for performing the read operation based at least in part on receiving the read command.

Some examples of the method 800 and the apparatus described herein may further include operations, features, circuitry, logic, means, or instructions for activating the row of the memory bank based at least in part receiving the activate command, where the row may be activated before or after performing the operation to prepare the memory device for the access operation.

Some examples of the method 800 and the apparatus described herein may further include operations, features, circuitry, logic, means, or instructions for activating the row of the memory bank based at least in part receiving the activate command, where the row may be activated at least partially concurrent with performing the operation to prepare the memory device for the access operation.

In some examples of the method 800 and the apparatus described herein, performing the operation may include operations, features, circuitry, logic, means, or instructions for activating a clock associated with writing based at least in part on the indicator in the activate command indicating the write operation.

In some examples of the method 800 and the apparatus described herein, performing the operation may include operations, features, circuitry, logic, means, or instructions for activating a clock associated with reading based at least in part on the indicator in the activate command indicating the read operation.

Some examples of the method 800 and the apparatus described herein may further include operations, features, circuitry, logic, means, or instructions for receiving a precharge command for the row, deactivating the clock based at least in part on the precharge command, receiving a second activate command including a second indicator that indicates a write operation associated with the second activate command, and activating a second clock associated with writing based at least in part on the indicator in the activate command indicating the write operation.

In some examples of the method 800 and the apparatus described herein, performing the operation may include operations, features, circuitry, logic, means, or instructions for activating a receiver of the memory device and receiving a set of data for the write operation using the activated receiver; or where the indicator indicates a read operation, and where performing the operation includes.

In some examples of the method 800 and the apparatus described herein, the indicator indicates a read operation and the method, apparatuses, and non-transitory computer-readable medium may include further operations, features, circuitry, logic, means, or instructions for transmitting a set of data from the read operation using the activated transmitter.

Figure 9:
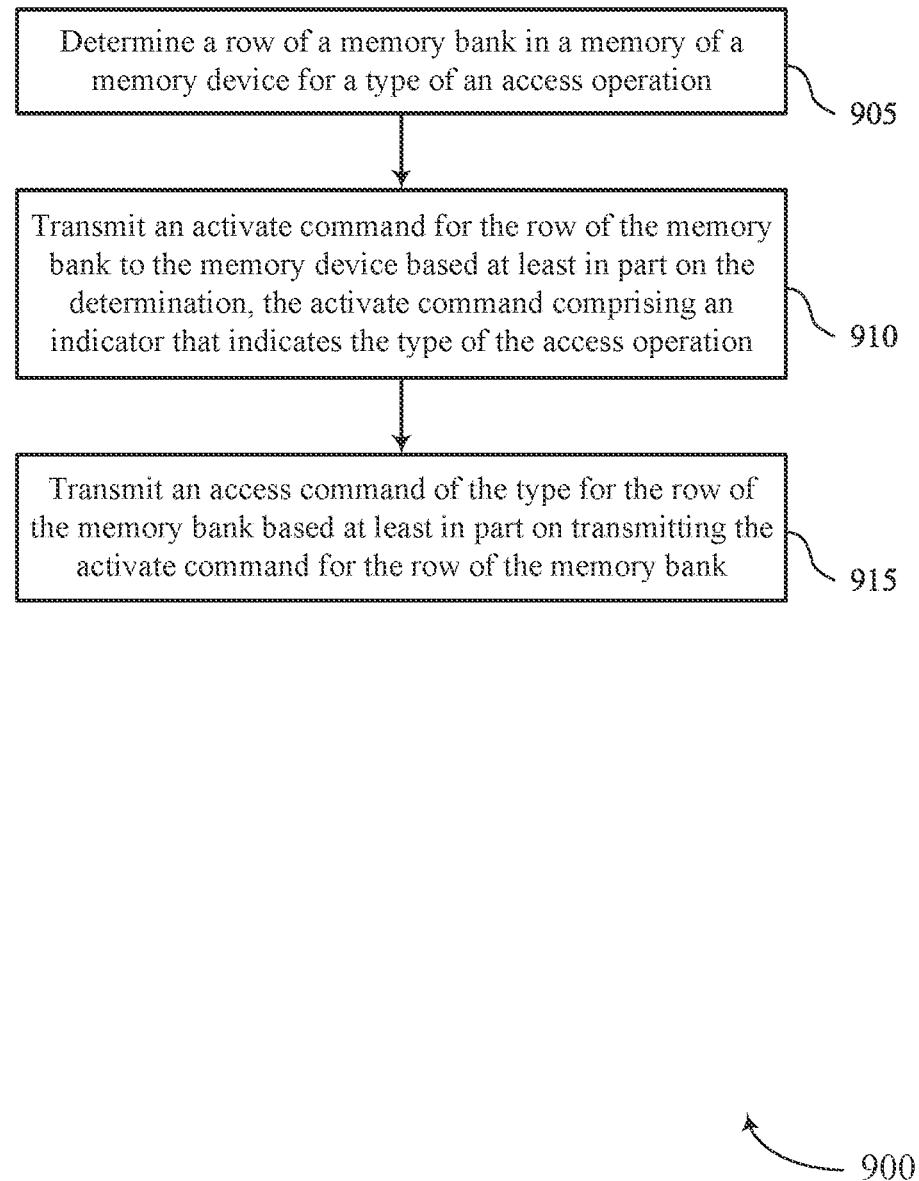

FIG. 9 shows a flowchart illustrating a method 900 that supports activate commands for memory preparation in accordance with examples as disclosed herein. The operations of method 900 may be implemented by a host device or its components as described herein. For example, the operations of method 900 may be performed by a host device as described with reference to FIGS. 1 through 4 and 6. In some examples, a host device may execute a set of instructions to control the functional elements of the device to perform the described functions. Additionally or alternatively, the host device may perform aspects of the described functions using special-purpose hardware.

At 905, the method may include determining a row of a memory bank in a memory of a memory device for a type of an access operation. The operations of 905 may be performed in accordance with examples as disclosed herein. In some examples, aspects of the operations of 905 may be performed by a control circuitry 625 as described with reference to FIG. 6.

At 910, the method may include transmitting an activate command for the row of the memory bank to the memory device based at least in part on the determination, the activate command including an indicator that indicates the type of the access operation. The operations of 910 may be performed in accordance with examples as disclosed herein. In some examples, aspects of the operations of 910 may be performed by a transmit circuitry 630 as described with reference to FIG. 6.

At 915, the method may include transmitting an access command of the type for the row of the memory bank based at least in part on transmitting the activate command for the row of the memory bank. The operations of 915 may be performed in accordance with examples as disclosed herein. In some examples, aspects of the operations of 915 may be performed by a transmit circuitry 630 as described with reference to FIG. 6.

In some examples, an apparatus as described herein may perform a method or methods, such as the method 900. The apparatus may include, features, circuitry, logic, means, or instructions (e.g., a non-transitory computer-readable medium storing instructions executable by a processor) for determining a row of a memory bank in a memory of a memory device for a type of an access operation, transmitting an activate command for the row of the memory bank to the memory device based at least in part on the determination, the activate command including an indicator that indicates the type of the access operation, and transmitting an access command of the type for the row of the memory bank based at least in part on transmitting the activate command for the row of the memory bank.

Some examples of the method 900 and the apparatus described herein may further include operations, features, circuitry, logic, means, or instructions for transmitting a second activate command that may be associated with a second access operation and that includes a second indicator that indicates the second access operation may be of the type.

Some examples of the method 900 and the apparatus described herein may further include operations, features, circuitry, logic, means, or instructions for determining that a second access operation associated with the row may be of the type and transmitting, based at least in part on determining that the second access operation may be of the type, a second activate command that may be associated with the second access operation and that excludes a second indicator that indicates the second access operation may be of the type.

In some examples of the method 900 and the apparatus described herein, and the method, apparatuses, and non-transitory computer-readable medium may include further operations, features, circuitry, logic, means, or instructions for transmitting a precharge command for the row of the memory bank, determining a second row for the write operation, and transmitting a second activate command to the memory device, the second activate command including a second indicator that indicates the write operation.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method at a memory device, comprising:
receiving an activate command for a row of a memory bank in the memory device, the activate command comprising an indicator that indicates a corresponding access command for the row of the memory bank is a write command or a read command;
activating a first clock associated with writing or a second clock associated with reading based at least in part on the indicator in the activate command; and
receiving the access command after activating the first clock or the second clock.

2. The method of claim 1, further comprising:
writing a set of data to the row of the memory bank, or reading a set of data from the row of the memory bank, based at least in part on receiving the access command.

3. The method of claim 1, wherein the indicator indicates that the access command is a write command, the method further comprising:
activating, before receiving the write command, a receiver based at least in part on the indicator in the activate command indicating the write command; and
receiving a set of data to be written to the row of the memory bank based at least in part on activating the receiver.

4. The method of claim 1, wherein the indicator indicates that the access command is a read command, the method further comprising:
activating, before receiving the read command, a transmitter based at least in part on the indicator in the activate command indicating the read command; and
transmitting a set of data from the row of the memory bank based at least in part on activating the transmitter.

5. The method of claim 1, further comprising:
receiving a precharge command for the row of the memory bank; and
deactivating the first clock or the second clock based at least in part on the precharge command.

6. The method of claim 1, further comprising:
receiving a second activate command for the row of the memory bank, the second activate command comprising a second indicator that indicates a second access command following the second activate command is of a same type as the access command.

7. The method of claim 1, further comprising:
receiving a second activate command for the row of the memory bank, the second activate command excluding a second indicator that indicates a second access command following the second activate command is of a same type as the access command.

8. A method at a memory device, comprising:
receiving an activate command for a row of a memory bank in the memory device, the activate command comprising an indicator that indicates a type of an access operation associated with the activate command;
performing, based at least in part on the type of the access operation, an operation to prepare the memory device for the access operation; and
receiving an access command for the access operation after performing the operation to prepare the memory device for the access operation.

9. The method of claim 8, wherein the access command comprises a write command and the access operation comprises a write operation, the method further comprising: performing the write operation based at least in part on receiving the write command.

10. The method of claim 8, wherein the access command comprises a read command and the access operation comprises a read operation, the method further comprising:
performing the read operation based at least in part on receiving the read command.

11. The method of claim 8, further comprising:
activating the row of the memory bank based at least in part receiving the activate command, wherein the row is activated before or after performing the operation to prepare the memory device for the access operation.

12. The method of claim 8, further comprising:
activating the row of the memory bank based at least in part receiving the activate command, wherein the row is activated at least partially concurrent with performing the operation to prepare the memory device for the access operation.

13. The method of claim 8, wherein the access operation comprises a write operation, and wherein performing the operation comprises:
activating a clock associated with writing based at least in part on the indicator in the activate command indicating the write operation.

14. The method of claim 8, wherein the access operation comprises a read operation, and wherein performing the operation comprises:
activating a clock associated with reading based at least in part on the indicator in the activate command indicating the read operation.

15. The method of claim 14, further comprising:
receiving a precharge command for the row;
deactivating the clock based at least in part on the precharge command;
receiving a second activate command comprising a second indicator that indicates a write operation associated with the second activate command; and
activating a second clock associated with writing based at least in part on the second indicator in the second activate command indicating the write operation.

16. The method of claim 8, wherein the indicator indicates a write operation, and wherein performing the operation comprises:
activating a receiver of the memory device; the method further comprising:
receiving a set of data for the write operation using the activated receiver.

17. A method at a controller, comprising:
determining a row of a memory bank in a memory of a memory device for a type of an access operation;
transmitting an activate command for the row of the memory bank to the memory device based at least in part on the determination, the activate command comprising an indicator that indicates the type of the access operation; and
transmitting an access command of the type for the row of the memory bank based at least in part on transmitting the activate command for the row of the memory bank.

18. The method of claim 17, further comprising:
transmitting a second activate command that is associated with a second access operation and that comprises a second indicator that indicates the second access operation is of the type.

19. The method of claim 17, further comprising:
determining that a second access operation associated with the row is of the type; and transmitting, based at least in part on determining that the second access operation is of the type, a second activate command that is associated with the second access operation and that excludes a second indicator that indicates the second access operation is of the type.

20. The method of claim 17, wherein determining comprises determining the row of the memory bank for a read operation, the method further comprising:

transmitting a precharge command for the row of the memory bank;

determining a second row for a write operation; and transmitting a second activate command to the memory device, the second activate command comprising a second indicator that indicates the write operation.

* * * * *